(12) United States Patent
Mahony et al.

(10) Patent No.: US 9,973,210 B1
(45) Date of Patent: May 15, 2018

(54) REDUCTION OF EXECUTION STALLS OF LZ4 DECOMPRESSION VIA PARALLELIZATION

(71) Applicant: EMC IP HOLDING COMPANY LLC, Hopkinton, MA (US)

(72) Inventors: Aidan O Mahony, Togher (IE); Alesia Tringale, Worcester, MA (US); Jason Jerome Duquette, Milford, MA (US); Philip O'Carroll, Glenbrook (IE)

(73) Assignee: EMC IP HOLDING COMPANY LLC, Hopkinton, MA (US)

( * ) Notice: Subject to any disclaimer, the term of this patent is extended or adjusted under 35 U.S.C. 154(b) by 0 days. days.

(21) Appl. No.: 15/668,783

(22) Filed: Aug. 4, 2017

(51) Int. Cl.
*H03M 7/34* (2006.01)
*H03M 7/30* (2006.01)

(52) U.S. Cl.
CPC ....... *H03M 7/6023* (2013.01); *H03M 7/3086* (2013.01); *H03M 7/6005* (2013.01)

(58) Field of Classification Search
CPC . H03M 7/6023; H03M 7/3086; H03M 7/6005
USPC ..................................................... 341/51, 87
See application file for complete search history.

(56) References Cited

U.S. PATENT DOCUMENTS

| | | | | |
|---|---|---|---|---|
| 6,145,069 A | * | 11/2000 | Dye | H03M 7/30 345/501 |
| 6,674,373 B1 | * | 1/2004 | Jones | H03M 7/3084 341/51 |

* cited by examiner

*Primary Examiner* — Khai M Nguyen
(74) *Attorney, Agent, or Firm* — Anderson Gorecki LLP (57) ABSTRACT

A parallel decompression engine has separate hardware paths for sequence processing and repeated byte copying/placement. Literal byte extraction logic obtains literal bytes from a selected sequence. Literal byte write logic writes the obtained literal bytes into an uncompressed data set that is being generated. Offset and length extraction logic obtains the offset and length of repeated bytes from the selected sequence. In a separate hardware path, copying and placement logic uses the offset and length to find and copy the length of repeated bytes at the specified offset in the uncompressed data set, and place the copied repeated bytes back into the uncompressed data set adjacent to the literal bytes.

20 Claims, 5 Drawing Sheets

REDUCTION OF EXECUTION STALLS OF LZ4 DECOMPRESSION VIA PARALLELIZATION

TECHNICAL FIELD

The subject matter of this disclosure is generally related to decompression of data that has been compressed with a lossless compression algorithm.

BACKGROUND

Within a computer network, servers may be used to host applications such as a database, file server or block server, for example and without limitation. Host application data may be maintained by a storage system such as a storage array. A single storage array may maintain host application data for multiple host applications running on multiple servers. Each storage array may include a plurality of interconnected computing nodes and a plurality of data storage devices such as HDDs (Hard Disk Drives) and SSDs (Solid State Drives). The host application data is stored on the data storage devices. The computing nodes manage access to the data storage devices. Some of the host application data may be stored in a compressed form. The compressed data may be decompressed by the computing nodes when the data is accessed by one of the host applications.

SUMMARY

All examples, aspects, features, and implementations mentioned in this document can be combined in any technically possible way.

In accordance with an aspect an apparatus comprises: a parallel decompression engine that processes a compressed data set to generate a corresponding uncompressed data set, the parallel decompression engine comprising: sequence processing logic comprising: literal byte extraction logic that obtains literal bytes from a selected sequence of the compressed data set; literal byte write logic that writes the obtained literal bytes into the uncompressed data set; and offset and length extraction logic that obtains an offset and length of repeated bytes from the selected sequence; and copying and placement logic that uses the offset and length to copy the length of repeated bytes at the offset in the uncompressed data set, and place the copied repeated bytes at a location in the uncompressed data set adjacent to the literal bytes of the selected sequence; wherein the sequence processing logic is implemented by a first hardware path and the copying and placement logic is implemented by a second hardware path. Some implementations comprise a first special purpose integrated circuit in which the sequence processing logic is implemented, and a second special purpose integrated circuit in which the copying and placement logic is implemented. Some implementations comprise a special purpose integrated circuit in which the parallel decompression engine is implemented, the special purpose integrated circuit comprising a first execution unit in which the sequence processing logic is implemented, and a second execution unit in which the copying and placement logic is implemented. Some implementations comprise a first processor core in which the sequence processing logic is implemented, and a second processor core in which the copying and placement logic is implemented. Some implementations comprise a first group of allocated processor cores in which the sequence processing logic is implemented, and a second group of allocated processor cores in which the copying and placement logic is implemented. Some implementations comprise pairings of individual processor cores of the first group with individual processor cores of the second group. Some implementations comprise a special purpose integrated circuit in which the sequence processing logic is implemented, and a general purpose multi-core processor in which the copying and placement logic is implemented. Some implementations comprise a general purpose multi-core processor in which the sequence processing logic is implemented, and a special purpose integrated circuit in which the copying and placement logic is implemented. Some implementations comprise a computing node in which the parallel decompression engine is implemented. Some implementations comprise a storage array in which the computing node is implemented.

In accordance with an aspect a method comprises: generating an uncompressed data set from a compressed data set, comprising: sequence processing in a first hardware path, comprising: obtaining literal bytes from a selected sequence of the compressed data set; writing the obtained literal bytes into the uncompressed data set; and obtaining an offset and length of repeated bytes from the selected sequence; and copying and placement processing in a second hardware path, comprising: using the offset and length for copying the length of repeated bytes at the offset in the uncompressed data set, and placing the copied repeated bytes at a location in the uncompressed data set adjacent to the literal bytes of the selected sequence. Some implementations comprise performing sequence processing with a first special purpose integrated circuit, and performing copying and placement processing with a second special purpose integrated circuit. Some implementations comprise performing parallel decompression with a special purpose integrated circuit, comprising performing sequence processing with a first execution unit of the special purpose integrated circuit, and performing copying and placement processing with a second execution unit of the special purpose integrated circuit. Some implementations comprise performing sequence processing with a first processor core, and performing copying and placement processing with a second processor core. Some implementations comprise performing sequence processing with a first group of allocated processor cores, and performing copying and placement processing with a second group of allocated processor cores. Some implementations comprise pairing individual processor cores of the first group with individual processor cores of the second group. Some implementations comprise performing sequence processing with a special purpose integrated circuit, and performing copying and placement processing with a general purpose multi-core processor. Some implementations comprise performing sequence processing with a general purpose multi-core processor, and performing copying and placement processing with a special purpose integrated circuit. Some implementations comprise operating the parallel decompression engine in a computing node. Some implementations comprise operating the parallel decompression engine in a storage array.

DETAILED DESCRIPTION

Aspects of the inventive concepts will be described as being implemented in a data storage system that includes a host server and storage array. Such implementations should not be viewed as limiting. Those of ordinary skill in the art will recognize that there are a wide variety of implementations of the inventive concepts in view of the teachings of the present disclosure.

Some aspects, features and implementations described herein may include machines such as computers, electronic components, optical components, and processes such as computer-implemented procedures and steps. It will be apparent to those of ordinary skill in the art that the computer-implemented procedures and steps may be stored as computer-executable instructions on a non-transitory computer-readable medium. Furthermore, it will be understood by those of ordinary skill in the art that the computer-executable instructions may be executed on a variety of tangible processor devices, i.e. physical hardware. For ease of exposition, not every step, device or component that may be part of a computer or data storage system is described herein. Those of ordinary skill in the art will recognize such steps, devices and components in view of the teachings of the present disclosure and the knowledge generally available to those of ordinary skill in the art. The corresponding machines and processes are therefore enabled and within the scope of the disclosure.

Figure 1:
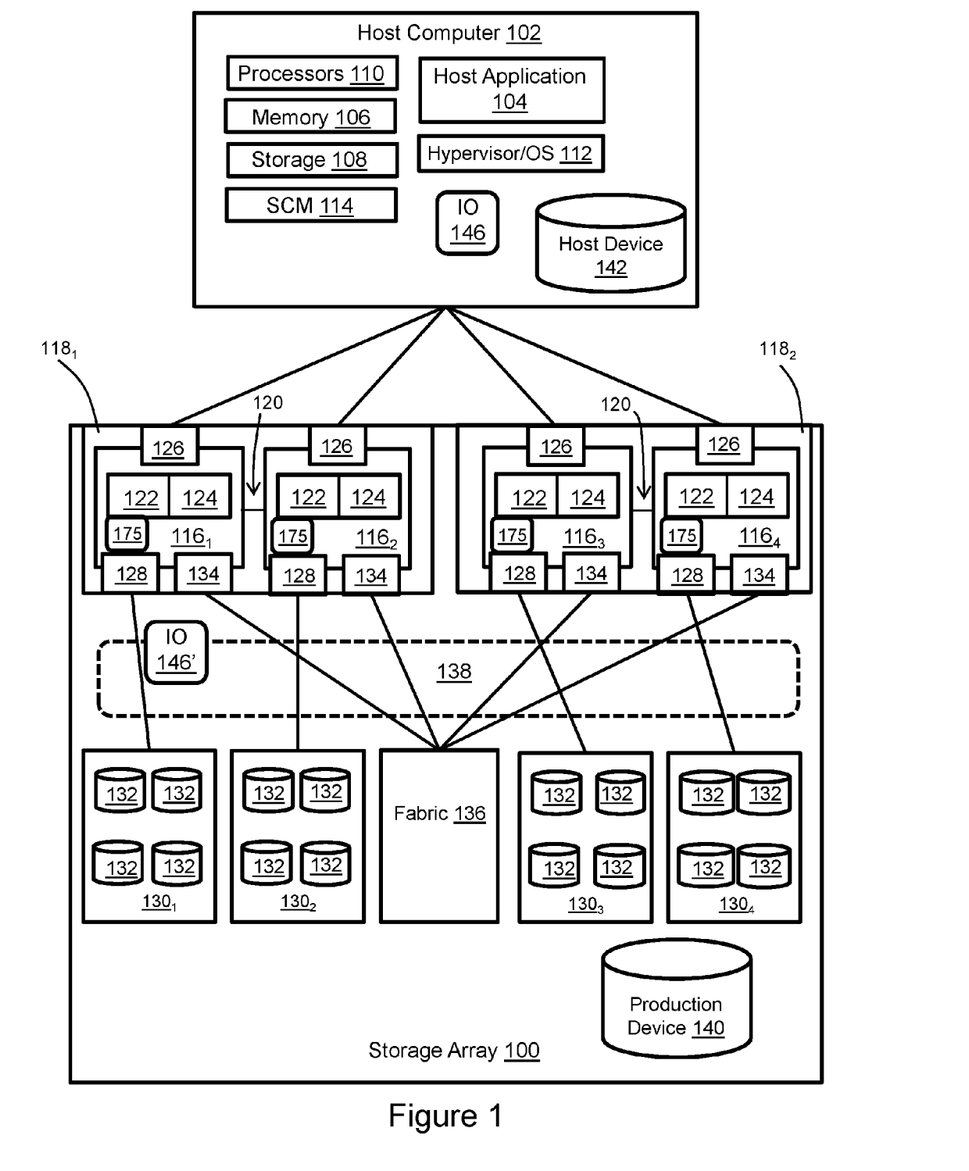
FIG. 1 is a block diagram that illustrates a host server and a storage array with a parallel decompression engine.

The terminology used in this disclosure is intended to be interpreted broadly within the limits of subject matter eligibility. The terms "logical" and "virtual" are used to refer to features that are abstractions of other features, e.g. and without limitation abstractions of tangible features. The term "physical" is used to refer to tangible features, including but not limited to electronic hardware. For example, multiple virtual computing devices could operate simultaneously on one physical computing device. The term "logic" is used to refer to special purpose physical circuit elements, firmware, software, computer instructions that are stored on a non-transitory computer-readable medium and implemented by multi-purpose tangible processors, and any combinations thereof FIG. 1 illustrates a storage array 100 and an associated host computer 102, of which there may be many. The storage array 100 provides data storage services for a host application 104, of which there may be more than one instance and type running on the host computer 102. In the illustrated example the host computer 102 is a server with volatile memory 106, persistent storage 108, one or more tangible processors 110, and a hypervisor or OS (operating system) 112. The processors 110 may include one or more multi-core processors that include multiple CPUs, GPUs, and combinations thereof. The volatile memory may include RAM (Random Access Memory) of any type. The persistent storage 108 may include tangible persistent storage components of one or more technology types, for example and without limitation SSDs and HDDs of any type, including but not limited to SCM (Storage Class Memory), EFDs (enterprise flash drives), SATA (Serial Advanced Technology Attachment) and FC (Fibre Channel). The host computer 102 might support multiple virtual hosts running on virtual machines or containers, and although an external host computer is illustrated, internal hosts may be instantiated within the storage array.

The storage array 100 includes a plurality of computing nodes $116_1$-$116_4$, possibly including but not limited to storage servers and specially designed compute engines or storage directors for providing data storage services. Pairs of the computing nodes, e.g. ($116_1$, $116_2$) and ($116_3$, $116_4$), may be organized as storage engines $118_1$, $118_2$, respectively, for purposes of failover between computing nodes. The paired computing nodes of each storage engine may be directly interconnected by communication links 120. Each computing node includes processors 122 and a local volatile memory 124. The processors 122 may include a plurality of multi-core processors of one or more types, e.g. including multiple CPUs, GPUs, and combinations thereof. The local volatile memory 124 may include, for example and without limitation, any type of RAM. Each computing node may also include one or more FEs (front end adapters) 126 for communicating with the host computer 102. Each computing node $116_1$-$116_4$ may also include one or more BEs (back end adapters) 128 for communicating with respective associated back end drive arrays $130_1$-$130_4$, thereby enabling access to managed drives 132. The managed drives 132 may include tangible persistent storage components of one or more technology types, for example and without limitation any of the SSDs and HDDs mentioned above. Each computing node may also include one or more CAs (channel adapters) 134 for communicating with other computing nodes via an interconnecting fabric 136. Each computing node may allocate a portion or partition of its respective local volatile memory 124 to a virtual shared "global" memory 138 that can be accessed by other computing nodes, e.g. via DMA (direct memory access) or RDMA (remote direct memory access).

The storage array 100 maintains data for the host applications running on the host computer 102. For example, host application 104 may write host application data to the storage array and read host application data from the storage array in order to perform various functions. Examples of host applications may include but are not limited to file servers, email servers, block servers and databases. Logical storage devices are created and presented to the host application 104 for storage of the host application data. For example, a production device 140 and a corresponding host device 142 are created to enable the storage array to provide storage services to the host application 104. Without limitation, the production device 140 may be referred to as a production device, production volume, production LUN or host LUN, where LUN (Logical Unit Number) is a number used to identify the logical storage volume in accordance with the SCSI (Small Computer System Interface) protocol. The host device 142 is a local (to host computer 102) representation of the production device 140. Multiple host devices associated with different host computers may be local representations of the same production device 140. The host device 142 and the production device 140 are abstraction layers between the managed drives 132 and the host application 104. From the perspective of the host application 104, the host device 142 is a single data storage device having a set of contiguous fixed-size LBAs (logical block addresses) on which data used by the host application resides and can be stored. However, the data used by the host application and the storage resources available for use by the host application may actually be maintained by the computing nodes 116₁-116₄ at non-contiguous addresses on various different managed drives 132.

In order to service IOs from the host application 104, the storage array 100 maintains metadata that indicates, among various things, mappings between the production device 140 and the locations of extents of host application data in the shared global memory 138 and the managed drives 132. In response to an IO (input/output command) 146 from the host application 104 to the host device 142, the hypervisor/OS 112 determines whether the IO 146 can be serviced by accessing the host computer memory 106. If that is not possible then the IO is serviced by to the storage array 100. There may be multiple paths between the host computer 102 and the storage array 100, e.g. one path per FE 126. The paths may be selected based on a wide variety of techniques and algorithms including, for context and without limitation, performance and load balancing. In the case where IO 146 is a read command the storage array 100 uses metadata to locate the commanded data, e.g. in the shared global memory 138 or managed drives 132. If the commanded data is not in the shared global memory 138 then the data is temporarily copied into the shared global memory from the managed drives 132 and sent to the host application via one of the computing nodes. In the case where the IO 146 is a write command the storage array may copy a block being written into the shared global memory 138, mark the data as dirty, and create new metadata that maps the production device address with a location to which the block is written on the managed drives. The shared global memory 138 may enable the production device 140 to be reachable via all of the computing nodes and paths, although the storage array can be configured to limit use of certain paths to certain production devices.

Some of the host application data may be stored in a compressed form on the managed drives 132. For example and without limitation, infrequently accessed data may be stored on HDDs, some or all of which may be compressed, and frequently accessed data may be stored on SCM or SSDs. Frequently accessed data may be stored in compressed form if the decompression resource cost is acceptable. Compression is a way of encoding information to reduce storage requirements, e.g. so as to require fewer bytes of storage space. Compression can be either lossy or lossless. Lossy compression removes unnecessary or less important information. Lossless compression identifies and reduces statistical redundancy in order to encode without information loss. A variety of lossless data compression algorithms and programs are known, including but not limited to RLE (run-length encoding), Huffman coding, PPM (prediction by partial matching), and LZxx (various Lempel-Ziv techniques). Typical lossless data compression algorithms generate a statistical model of the uncompressed input data and then use the statistical model to map the uncompressed input data, e.g. using a sliding window. LZ4, which will be used in this description as an example of a lossless compression algorithm, but which should not be viewed as limiting, compresses an uncompressed data set into a series of sequences, where each sequence includes literal bytes and a pointer to repeated bytes. The literal bytes of a sequence may be viewed as being unique in the sense that those bytes have not yet been repeated in the uncompressed data set during the compression process. The pointer is an offset and length that represents a repeated set of bytes in the uncompressed data set. In order to decompress a data set that has been compressed with LZ4, the sequences are processed sequentially beginning with the first generated sequence during the compression process. Each sequence may be processed in two sequential steps. In a first step, the literal bytes of the selected sequence are copied to a decompressed output data set. In a second step, the length of bytes, starting at the offset indicated by the pointer, are copied from the decompressed output data set to the end of the decompressed output data set. The size of the repeated pattern of bytes may be relatively large or relatively small, so the time required to complete the copy operation associated with the second step can vary. Variability in the time required to complete the second step may be problematic because it can cause an execution stall, e.g. where a CPU is occupied for many cycles with copying a large repeated set of bytes.

Each computing node in the illustrated storage array 100 includes a parallel decompression engine 175. Each parallel decompression engine functions to decompress the compressed data that is retrieved from the managed drives 132. As will be explained in greater detail below, each parallel decompression engine includes parallel hardware paths or modules that separately implement the two steps associated with decompressing a sequence of a compressed data set. Although it should not be viewed as a limitation, the parallel paths or modules may help to reduce the likelihood of execution stalls.

Figure 2:
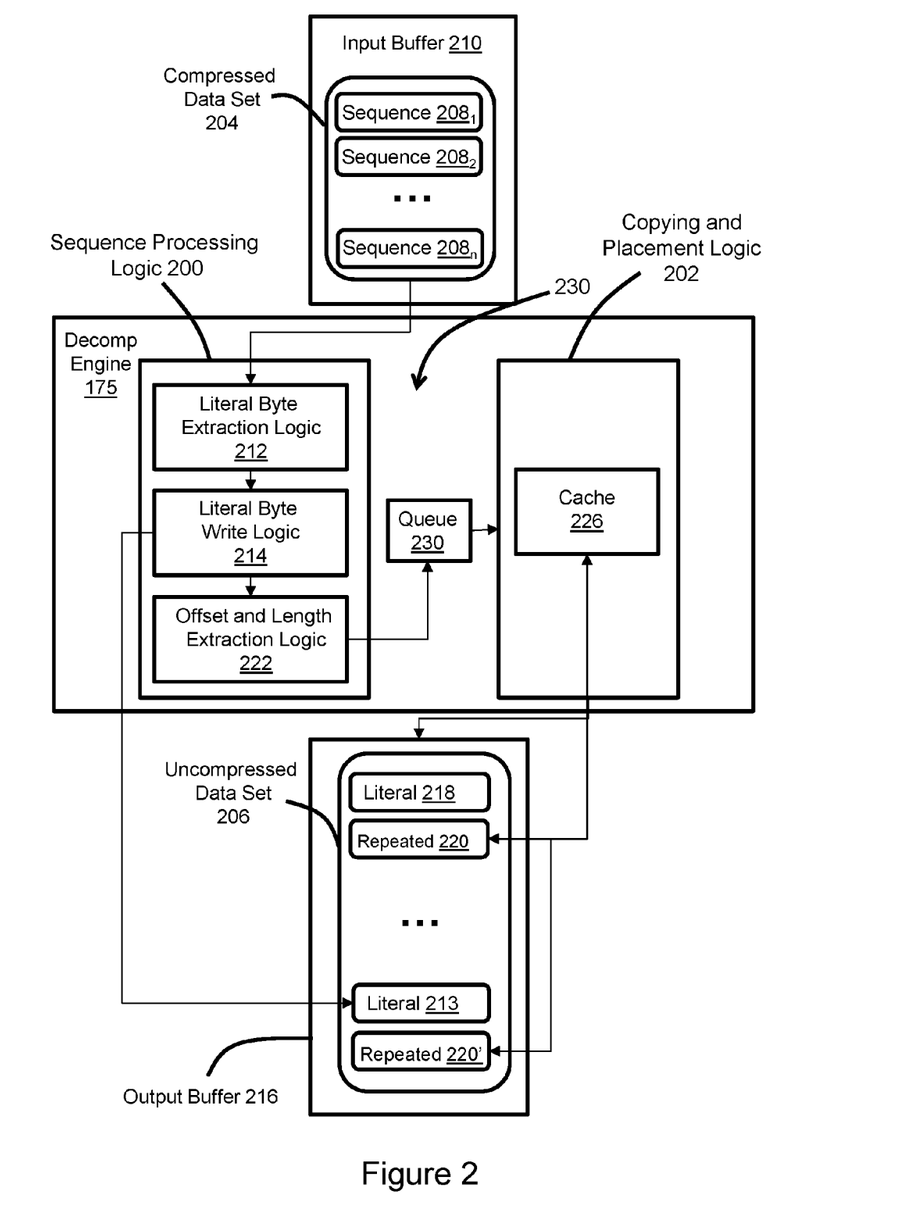
FIG. 2 is a functional block diagram of the parallel decompression engine of FIG. 1.

FIG. 2 is a functional block diagram of one of the parallel decompression engines 175 of FIG. 1. The parallel decompression engine includes sequence processing logic 200 and parallel copying and placement logic 202. The parallel decompression engine 175 processes a compressed data set 204 to generate a corresponding uncompressed data set 206. Sequences 208₁-208ₙ of the compressed data set 204 are selected and processed in order beginning with the first generated sequence. A selected sequence is copied from an input buffer 210 into the sequence processing logic 200. The sequence processing logic 200 includes literal byte extraction logic 212, literal byte write logic 214, and offset and length extraction logic 222. The literal byte extraction logic 212 obtains the literal bytes from the selected sequence. The literal byte write logic 214 writes the obtained literal bytes 213 into output buffer 216. More particularly, the literal bytes 213 are written to memory locations at the end of the uncompressed data set 206 that is being generated, i.e., sequentially following the locations of previously written literal bytes 218, previously written repeated bytes 220, and any other previously written literal bytes and repeated bytes. The offset and length extraction logic 222 obtains the offset and length pointer to repeated bytes from the selected sequence and provides the offset and length to the copying and placement logic 202 via a queue 230. The queue functions as a buffer between the sequence processing logic 200 and the parallel copying and placement logic 202. The sequence processing logic may run in a more deterministic manner, whereas the parallel copying and placement logic is more variable. Consequently, the buffer may help to mitigate stalls. The copying and placement logic 202 uses the offset and length to find and copy the length of repeated bytes at the specified offset in the uncompressed data set 206, from the output buffer 216, into cache 226, and place the copied repeated bytes back into the output buffer 206 at the end of the uncompressed data set being generated. For example, repeated bytes 220 may be copied from the output buffer 216 into the cache 226, and from the cache 226 back into the output buffer 216 as repeated bytes 220' adjacent to (e.g. following) literal bytes 213. The sequence processing logic 200 may fetch and begin processing the next sequence from the compressed data set 204 while the copy and placement logic 202 is performing the copy and placement operation.

Figure 3A:
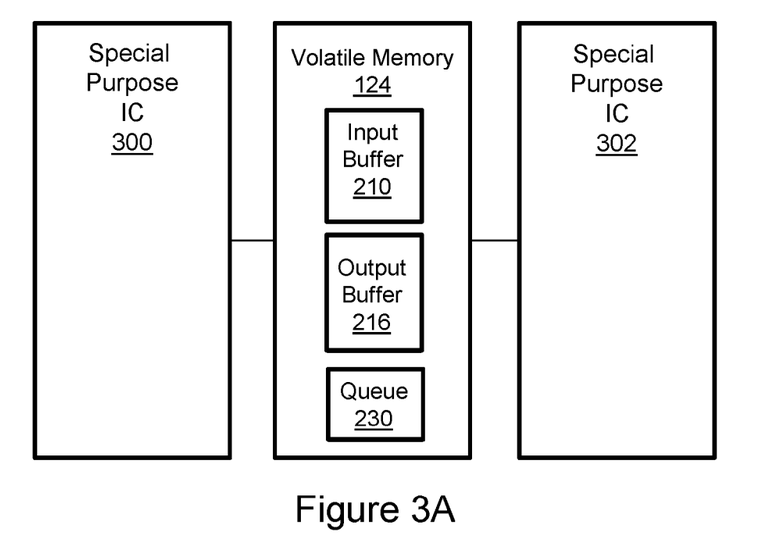
FIG. 3A illustrates an implementation of the parallel decompression engine with parallel special purpose ICs.

FIG. 3A illustrates an implementation of the parallel decompression engine with two special purpose ICs (integrated circuits) 300, 302. The sequence processing logic 200 (FIG. 2) is implemented by special purpose IC 300. The copying and placement logic 202 (FIG. 2) is implemented by special purpose IC 302. The special purpose ICs may include but are not limited to, alone or in any combination, ASICs (application-specific integrated circuits), FPGAs (field-programmable gate arrays), and ASSPs (application-specific standard products). Both of the special purpose ICs 300, 302 are connected with the volatile memory 124, in which input buffer 210, output buffer 216 and queue 230 are allocated.

Figure 3B:
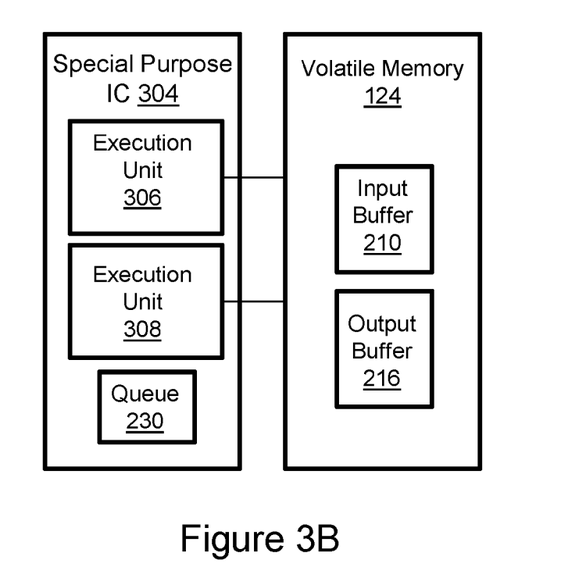
FIG. 3B illustrates an implementation of the parallel decompression engine with a single special purpose IC having parallel execution units.

FIG. 3B illustrates an implementation of the parallel decompression engine with one special purpose IC 304 having separate hardware paths. The special purpose IC 304 includes parallel execution units 306, 308, of which there may be many such parallel pairings. Examples of execution units may include but are not limited to Open CL (Open Computing Language) kernels, FPGA engines, CPU cores, and GPU execution units. Each execution unit is associated with a separate hardware path. The sequence processing logic 200 (FIG. 2) is implemented by execution unit 306. The copying and placement logic 202 (FIG. 2) is implemented by execution unit 308. The special purpose IC 304 may include but is not limited to, alone or in any combination, ASICs, FPGAs, and ASSPs. Both of the execution unit 306, 308 are connected with the volatile memory 124, in which input buffer 210 and output buffer 216 are allocated. Queue 230 may be implemented in cache of the special purpose IC 304.

Figure 4:
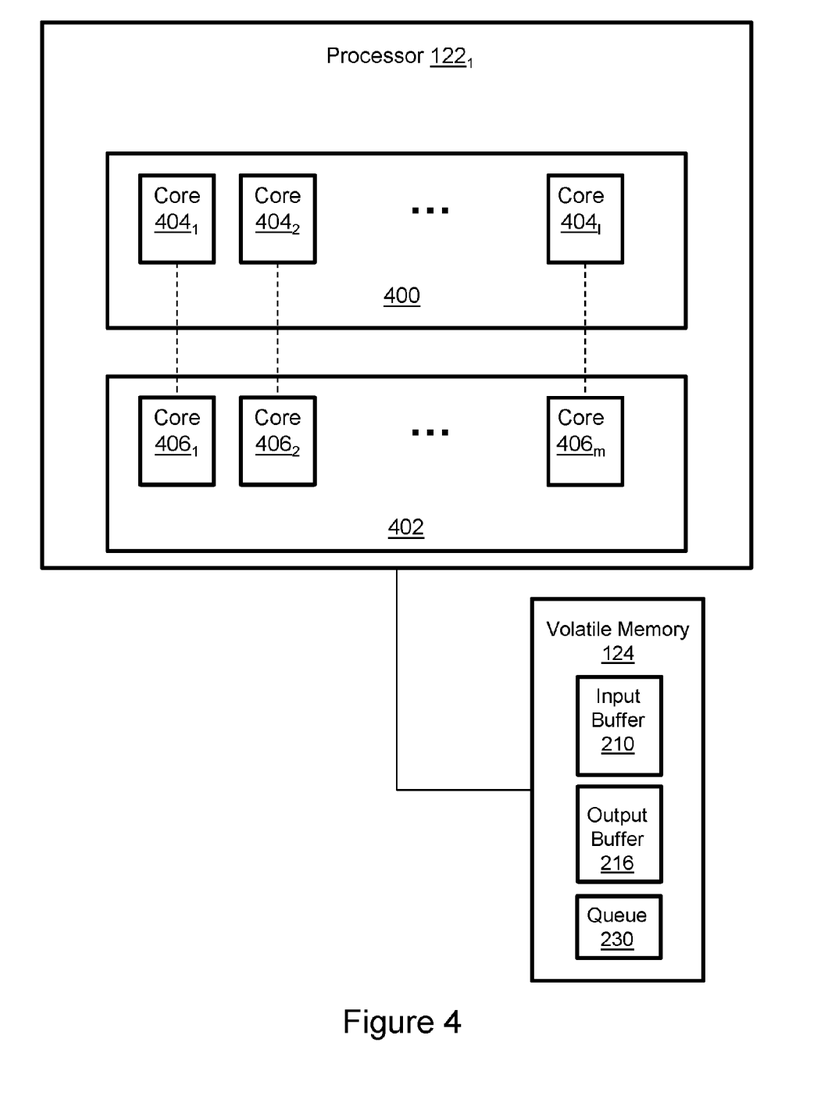
FIG. 4 illustrates an implementation of the parallel decompression engine with paired processor cores.

FIG. 4 illustrates an implementation of the parallel decompression engine with a processor 122₁, which may be one of the processors 122 (FIG. 1) of the computing engines. The processor 1221 may include one or more multi-core processors that include multiple CPU cores, GPU cores, and/or combinations thereof. Processor 122₁ might be dedicated for data decompression, or used for a variety of purposes. The processor 122₁ includes parallel groups 400, 402 of cores. Core group 400 includes cores $404_1$-$404_1$. Core group 402 includes cores $406_1$-$406_m$. The sequence processing logic 200 (FIG. 2) is implemented by the cores of group 400. The copying and placement logic 202 (FIG. 2) is implemented by the cores of group 402. Individual cores in group 400 may be paired with individual cores in group 402 for parallel processing of sequences, e.g. paired cores ($404_1$, $406_1$) may process a first set of sequences, and paired cores ($404_2$, $406_2$) may process a second set of sequences. Both of the core groups are connected with the volatile memory 124, in which input buffer 210, output buffer 216 and queue 230 are allocated.

Figure 5:
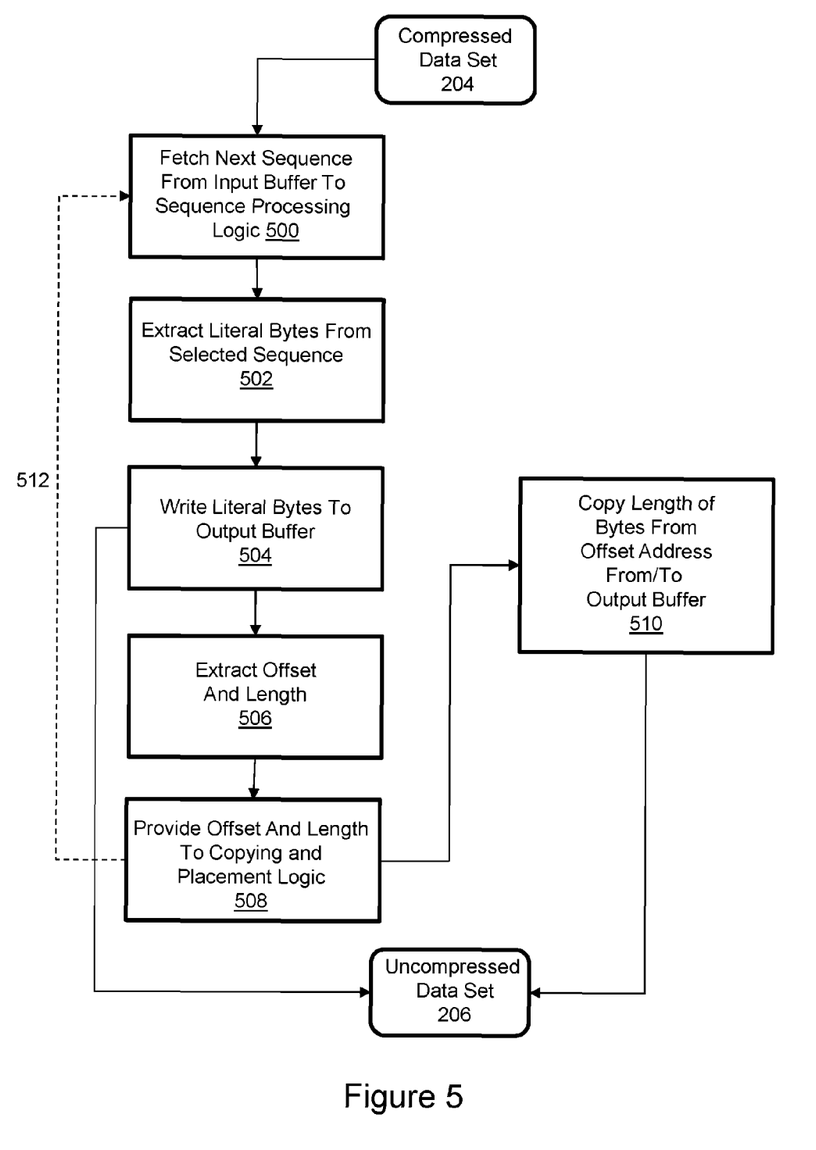
FIG. 5 is a flow diagram of parallel decompression.

FIG. 5 is a flow diagram of parallel decompression. Sequences of a compressed data set 204 are selected and fetched in order of compression-generation from the input buffer and provided to the sequence processing logic as indicated in block 500. The literal bytes are extracted from the selected sequence as indicated in block 502. The literal bytes are written to the output buffer containing the uncompressed data set 206 being generated as indicated in block 504. The offset and length of repeated bytes are extracted from the selected sequence as indicated in block 506. The offset and length are provided to the copying and placement logic as indicated in block 508. The length of repeated bytes are copied, starting at the offset, from the output buffer and placed at the end of the uncompressed data set 206 being generated by the copying and placement logic as indicated in block 510. The process continues until all of the sequences in the compressed data set 204 have been processed and the uncompressed data set 206 is complete. As indicated by connector 512, processing of the next sequence of the compressed data set by the sequence processing logic can commence while the selected sequence is still being processed by the copying and placement logic as described in block 510.

A number of features, aspects, embodiments and implementations have been described. Nevertheless, it will be understood that a wide variety of modifications and combinations may be made without departing from the scope of the inventive concepts described herein. Accordingly, those modifications and combinations are within the scope of the following claims.

What is claimed is:

1. An apparatus comprising:
   a parallel decompression engine that processes a compressed data set to generate a corresponding uncompressed data set, the parallel decompression engine comprising:
   sequence processing logic comprising:
   literal byte extraction logic that obtains literal bytes from a selected sequence of the compressed data set;
   literal byte write logic that writes the obtained literal bytes into the uncompressed data set; and
   offset and length extraction logic that obtains an offset and length of repeated bytes from the selected sequence; and
   copying and placement logic that uses the offset and length to copy the length of repeated bytes at the offset in the uncompressed data set, and place the copied repeated bytes at a location in the uncompressed data set adjacent to the literal bytes of the selected sequence;
   wherein the sequence processing logic is implemented by a first hardware path and the copying and placement logic is implemented by a second hardware path.

2. The apparatus of claim 1 comprising a first special purpose integrated circuit in which the sequence processing logic is implemented, and a second special purpose integrated circuit in which the copying and placement logic is implemented.

3. The apparatus of claim 1 comprising a special purpose integrated circuit in which the parallel decompression engine is implemented, the special purpose integrated circuit comprising a first execution unit in which the sequence processing logic is implemented, and a second execution unit in which the copying and placement logic is implemented.

4. The apparatus of claim 1 comprising a first processor core in which the sequence processing logic is implemented, and a second processor core in which the copying and placement logic is implemented.

5. The apparatus of claim 1 comprising a first group of allocated processor cores in which the sequence processing logic is implemented, and a second group of allocated processor cores in which the copying and placement logic is implemented.

6. The apparatus of claim 5 comprising pairings of individual processor cores of the first group with individual processor cores of the second group.

7. The apparatus of claim 1 comprising a special purpose integrated circuit in which the sequence processing logic is implemented, and a general purpose multi-core processor in which the copying and placement logic is implemented.

8. The apparatus of claim 1 comprising a general purpose multi-core processor in which the sequence processing logic is implemented, and a special purpose integrated circuit in which the copying and placement logic is implemented.

9. The apparatus of claim 1 comprising a computing node in which the parallel decompression engine is implemented.

10. The apparatus of claim 9 comprising a storage array in which the computing node is implemented.

11. A method comprising:
   generating an uncompressed data set from a compressed data set, comprising:
      sequence processing in a first hardware path, comprising:
         obtaining literal bytes from a selected sequence of the compressed data set;
         writing the obtained literal bytes into the uncompressed data set; and
         obtaining an offset and length of repeated bytes from the selected sequence; and
      copying and placement processing in a second hardware path, comprising:
         using the offset and length for copying the length of repeated bytes at the offset in the uncompressed data set, and placing the copied repeated bytes at a location in the uncompressed data set adjacent to the literal bytes of the selected sequence.

12. The method of claim 11 comprising performing sequence processing with a first special purpose integrated circuit, and performing copying and placement processing with a second special purpose integrated circuit.

13. The method of claim 11 comprising performing parallel decompression with a special purpose integrated circuit, comprising performing sequence processing with a first execution unit of the special purpose integrated circuit, and performing copying and placement processing with a second execution unit of the special purpose integrated circuit.

14. The method of claim 11 comprising performing sequence processing with a first processor core, and performing copying and placement processing with a second processor core.

15. The method of claim 11 comprising performing sequence processing with a first group of allocated processor cores, and performing copying and placement processing with a second group of allocated processor cores.

16. The method of claim 15 comprising pairing individual processor cores of the first group with individual processor cores of the second group.

17. The method of claim 11 comprising performing sequence processing with a special purpose integrated circuit, and performing copying and placement processing with a general purpose multi-core processor.

18. The method of claim 11 comprising performing sequence processing with a general purpose multi-core processor, and performing copying and placement processing with a special purpose integrated circuit.

19. The method of claim 11 comprising operating the parallel decompression engine in a computing node.

20. The method of claim 19 comprising operating the parallel decompression engine in a storage array.

* * * * *